United States Patent
Chen et al.

(10) Patent No.: US 9,972,779 B2
(45) Date of Patent: May 15, 2018

(54) RESISTIVE RANDOM ACCESS MEMORY

(71) Applicant: Winbond Electronics Corp., Taichung (TW)

(72) Inventors: Frederick Chen, Taichung (TW); Ping-Kun Wang, Taichung (TW); Shao-Ching Liao, Taichung (TW); Po-Yen Hsu, Taichung (TW); Yi-Hsiu Chen, Taichung (TW); Ting-Ying Shen, Taichung (TW); Bo-Lun Wu, Taichung (TW); Meng-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days. days.

(21) Appl. No.: 14/967,386

(22) Filed: Dec. 14, 2015

(65) Prior Publication Data
US 2017/0170394 A1 Jun. 15, 2017

(51) Int. Cl.
*H01L 47/00* (2006.01)
*H01L 45/00* (2006.01)

(52) U.S. Cl.
CPC ........ *H01L 45/1266* (2013.01); *H01L 45/085* (2013.01); *H01L 45/124* (2013.01); *H01L 45/146* (2013.01)

(58) Field of Classification Search
CPC . H01L 45/1266; H01L 45/085; H01L 45/124; H01L 45/146
See application file for complete search history.

(56) References Cited

U.S. PATENT DOCUMENTS

| | | | |
|---|---|---|---|
| 8,963,114 B2* | 2/2015 | Liao | H01L 45/04 257/2 |
| 9,076,519 B2 | 7/2015 | Hong et al. | |
| 9,257,642 B1* | 2/2016 | Chang | H01L 45/1253 |
| 9,385,316 B2* | 7/2016 | Liao | H01L 45/146 |
| 2009/0102598 A1* | 4/2009 | Yamazaki | H01L 45/04 338/20 |
| 2011/0291066 A1* | 12/2011 | Baek | H01L 45/08 257/4 |

(Continued)

FOREIGN PATENT DOCUMENTS

| | | |
|---|---|---|
| TW | 201436110 | 9/2014 |
| TW | 201539816 | 10/2015 |

OTHER PUBLICATIONS

"Office Action of Taiwan Counterpart Application", dated Oct. 24, 2016, p.1-p.4, in which the listed reference was cited.

*Primary Examiner* — Mark Tornow
(74) *Attorney, Agent, or Firm* — JCIPRNET

(57) ABSTRACT

A resistive random access memory is provided. The resistive random access memory includes a bottom electrode, a top electrode, a resistance-switching layer, an oxygen exchange layer, and a sidewall protective layer. The bottom electrode is disposed over a substrate. The top electrode is disposed over the bottom electrode. The resistance-switching layer is disposed between the bottom electrode and the top electrode. The oxygen exchange layer is disposed between the resistance-switching layer and the top electrode. The sidewall protective layer as an oxygen supply layer is at least disposed at sidewalls of the oxygen exchange layer.

8 Claims, 2 Drawing Sheets

(56) References Cited

U.S. PATENT DOCUMENTS

2013/0112935 A1\* 5/2013 Himeno ................. H01L 45/08
                                                                  257/4
2014/0264229 A1   9/2014 Yang et al.
2015/0104882 A1   4/2015 Jung et al.

\* cited by examiner

RESISTIVE RANDOM ACCESS MEMORY

BACKGROUND OF THE INVENTION

Field of the Invention

The invention relates to a non-volatile memory, and particularly a resistive random access memory.

Description of Related Art

The resistive random access memory (RRAM) is a type of non-volatile memory. With advantages including low voltage of write operations, short time for erasing writes, long memory time, non-destructive reading, multi-state memory, structural simplicity, and little space required, the resistive random access memory will become one of the non-volatile memory devices generally adopted in personal computers and electronic devices, and it is being widely researched.

Generally speaking, the resistive random access memory has a metal-insulating layer-metal (MIM) structure composed of a top electrode, a bottom electrode, and an intervening resistance-switching layer. However, in the manufacturing process of a resistive random access memory, sidewalls of the metal-insulating layer-metal structure are subject to plasma damage or contamination by impurities, which affects conductive paths (positions of a filament structure) in the resistive random access memory and further deteriorate the high-temperature data retention (HTDR). Therefore, in the manufacturing process of resistive random access memory devices, solving problems including plasma damage and contamination by impurities caused to the sidewalls of the metal-insulating layer-metal structure has become an important issue in the current development of the resistive random access memory technologies.

SUMMARY OF THE INVENTION

The invention provides a resistive random access memory capable of enhancing the high-temperature data retention property and durability of memory devices and improving the yield and stability of memory devices.

The resistive random access memory of the invention includes a bottom electrode, a top electrode, a resistance-switching layer, an oxygen exchange layer, and a sidewall protective layer. The bottom electrode is disposed over a substrate. The top electrode is disposed over the bottom electrode. The resistance-switching layer is disposed between the bottom electrode and the top electrode. The oxygen exchange layer is disposed between the resistance-switching layer and the top electrode. The sidewall protective layer as an oxygen supply layer is at least disposed at sidewalls of the oxygen exchange layer.

In one embodiment of the invention, the oxygen supply layer is further disposed at sidewalls of the bottom electrode, the resistance-switching layer, and the top electrode.

In one embodiment of the invention, the resistive random access memory further includes an oxygen-rich layer. The oxygen-rich layer is disposed between the oxygen exchange layer and the top electrode.

In one embodiment of the invention, the resistive random access memory further includes a block layer. The block layer is disposed between the oxygen exchange layer and the resistance-switching layer.

In one embodiment of the invention, a material of the oxygen supply layer includes aluminum oxide ($Al_2O_3$), silicon oxide ($SiO_2$), hafnium oxide ($HfO_2$), or zirconium oxide ($ZrO_2$).

In one embodiment of the invention, a material of the oxygen exchange layer includes titanium, tantalum, hafnium, zirconium, platinum, or aluminum.

In one embodiment of the invention, a material of the oxygen-rich layer includes titanium oxynitride or tantalum oxynitride.

The resistive random access memory of the invention includes a bottom electrode, a top electrode, a resistance-switching layer, and a sidewall protective layer. The bottom electrode is disposed over a substrate. The top electrode is disposed over the bottom electrode. The resistance-switching layer is disposed between the bottom electrode and the top electrode. The sidewall protective layer as a liner layer is disposed at sidewalls of the bottom electrode, the resistance-switching layer, and the top electrode.

In one embodiment of the invention, a material of the liner layer includes a metal oxide.

In one embodiment of the invention, the metal oxide includes aluminum oxide, titanium oxide, tantalum oxide ($TaO_2$), or zirconium oxide.

In one embodiment of the invention, the material of the liner layer is further doped with nitrogen.

In one embodiment of the invention, the liner layer includes a first liner layer and a second liner layer. The first liner layer is disposed at sidewalls of the bottom electrode, the resistance-switching layer, and the top electrode. The second liner layer is disposed on the first liner layer.

In one embodiment of the invention, a material of the first liner layer includes a metal oxide.

In one embodiment of the invention, the material of the first liner layer includes aluminum oxide, titanium oxide, tantalum oxide, or zirconium oxide.

In one embodiment of the invention, a material of the second liner layer includes a nitride or a metal titanate.

In one embodiment of the invention, the material of the second liner layer includes aluminum nitride, silicon nitride, or tantalum nitride.

In one embodiment of the invention, the material of the second liner layer includes strontium titanate or bismuth titanate.

In one embodiment of the invention, the resistive random access memory further includes a capping layer. The capping layer is disposed between the bottom electrode and the substrate.

In one embodiment of the invention, a material of the capping layer includes a metal oxide.

In one embodiment of the invention, the material of the capping layer includes aluminum oxide, titanium oxide, tantalum oxide, or zirconium oxide.

In light of the above, in the resistive random access memory of the invention, since the sidewall protective layer as an oxygen supply layer is disposed at the sidewalls of the oxygen exchange layer, such that an outer portion of the oxygen exchange layer is partially oxidized. Accordingly, oxygen vacancy density increases at a central portion of the resistance-switching layer below the oxygen exchange layer, and a filament structure is concentrated at the central portion of the resistance-switching layer and kept away from sidewall portions where the filament structure is subject to plasma damage or contamination by impurities. The concentrated filament structure also contributes to enhancement of the high-temperature data retention property of memory devices. Moreover, the sidewall protective layer as an oxygen supply layer also prevents outward spreading of oxygen drawn toward the central filament structure, thereby ensuring return of oxygen in a reset operation and improving durability.

In addition, in the resistive random access memory of the invention, since at least one layer of the sidewall protective layer is disposed at the sidewalls of the bottom electrode, the resistance-switching layer, and the top electrode (metal-insulating layer-metal structure), contaminants (such as hydrogen) from the interlayer insulating layer are prevented from spreading into the metal-insulating layer-metal structure and further affecting performance of the resistive random access memory.

In addition, since the capping layer is further disposed between the bottom electrode and the substrate (interlayer insulating layer), the metal-insulating layer-metal structure is completely insulated from the interlayer insulating layer, and contaminants (such as hydrogen) from the interlayer insulating layer are further prevented from spreading into the metal-insulating layer-metal structure.

To provide a further understanding of the aforementioned and other features and advantages of the invention, exemplary embodiments, together with the reference drawings, are described in detail below.

DESCRIPTION OF THE EMBODIMENTS

Figure 1A:
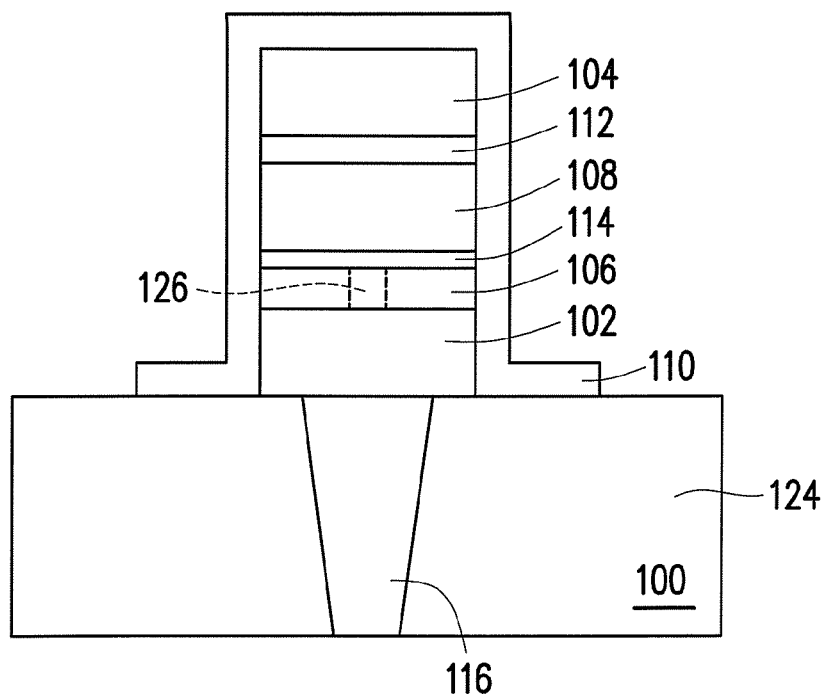
FIG. 1A is a cross-sectional view of a resistive random access memory according to a first embodiment of the invention.

The concept of the invention may be more sufficiently understood with reference to the attached drawings that show the embodiments of the invention. However, the invention may be further realized in many different forms and should not be interpreted as limited to the embodiments described below. In fact, the embodiments provided below merely serve to elaborate the invention more completely and in detail, and to fully convey the scope of the invention to people of ordinary skill in the art.

In the drawings, sizes and relative sizes of each layer and region may be illustrated in exaggeration for the sake of clarity.

Figure 1B:
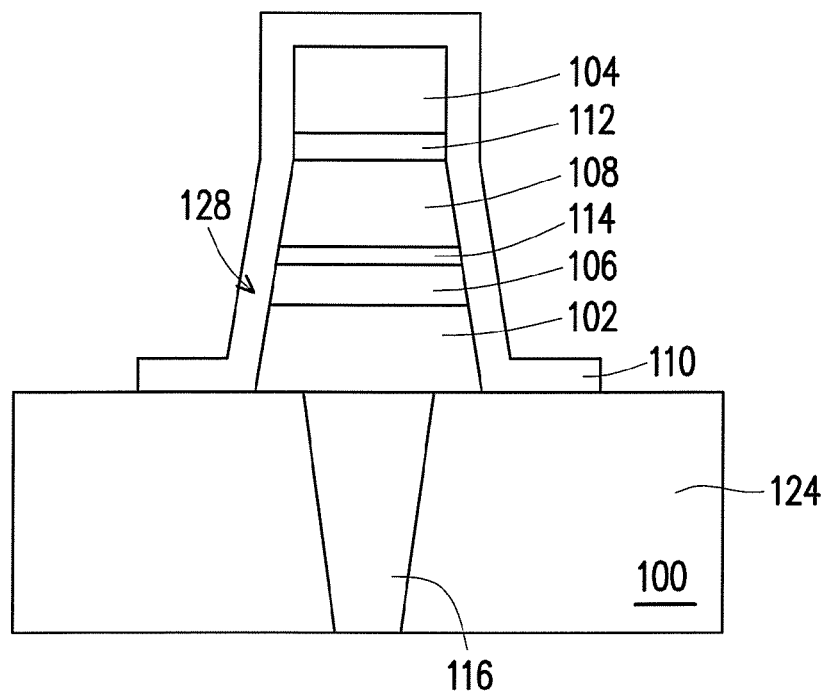
FIG. 1B is a cross-sectional view of a resistive random access memory according to a modified first embodiment of the invention.

FIG. 1A is a cross-sectional view of a resistive random access memory according to a first embodiment of the invention. FIG. 1B is a cross-sectional view of a resistive random access memory according to a modified first embodiment of the invention.

Referring to FIG. 1A, the resistive random access memory includes a bottom electrode 102, a top electrode 104, a resistance-switching layer 106, an oxygen exchange layer 108, and a sidewall protective layer 110.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed on the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example. The bottom electrode 102 should not form an abrupt corner at its interface with the resistance-switching layer 106 in order to avoid unwanted filaments at that location.

The oxygen exchange layer 108 is disposed between the resistance-switching layer 106 and the top electrode 104. A material of the oxygen exchange layer 108 is titanium, tantalum, hafnium, zirconium, platinum, or aluminum, for example. The oxygen exchange layer 108 is formed by the method of physical vapor deposition (PVD) or atomic layer deposition (ALD), for example.

The sidewall protective layer 110, as an oxygen supply layer, for example, is at least disposed at sidewalls of the oxygen exchange layer 108. A material of the sidewall protective layer 110 (oxygen supply layer) includes aluminum oxide ($Al_2O_3$), silicon oxide ($SiO_2$), hafnium oxide ($HfO_2$), or zirconium oxide ($ZrO_2$). The sidewall protective layer 110 is formed by the method of atomic layer deposition (ALD), for example.

As FIG. 1A shows, an oxygen-rich layer 112 is further optionally disposed between the oxygen exchange layer 108 and the top electrode 104. The oxygen-rich layer 112 prevents current spreading so as to increase current density and further enhance the high-temperature data retention ability. A material of the oxygen-rich layer 112 is titanium oxynitride or tantalum oxynitride, for example. The oxygen-rich layer 112 is formed by the method of physical vapor deposition (PVD) or atomic layer deposition (ALD), for example.

A block layer 114 is further optionally disposed between the oxygen exchange layer 108 and the resistance-switching layer 106. A material of the block layer 114 includes aluminum oxide ($Al_2O_3$). The block layer 114 is formed by the method of physical vapor deposition (PVD) or atomic layer deposition (ALD), for example. The oxygen exchange layer 108 should not form an abrupt corner with the block layer 114 in order to avoid unwanted filaments at that location. Preferably, the edges of the oxygen exchange layer 108 and the block layer 114 and the resistance-switch layer 106 are continuously linked.

As FIG. 1B shows, a stack of bottom electrode 102, a resistance-switching layer 106 and an oxygen exchange layer 108 has sloped sidewalls 128. A sloped sidewall 128 is better to avoid abrupt corner formed between resistance-switching layer 106 and oxygen exchange layer 108.

In the present embodiment, since the sidewall protective layer 110 (oxygen supply layer) is disposed at the sidewalls of the oxygen exchange layer 108, oxygen in the sidewall protective layer 110 (oxygen supply layer) is drawn into the oxygen exchange layer 108, such that an outer portion of the oxygen exchange layer 108 is partially oxidized. Accordingly, the resistance-switching layer 106 below the oxygen exchange layer 108 generates an oxygen vacancy segment at a central portion only, which contributes to the formation of a filament structure 126. In other words, when oxygen vacancy density increases at the central portion, the filament structure 126 is concentrated at the central portion. The concentrated filament structure 126 also contributes to enhancement of the high-temperature data retention (HTDR) property of memory devices. Moreover, the sidewall protective layer 110 (oxygen supply layer) also prevents outward spreading of oxygen drawn toward the central filament structure 126, thereby ensuring return of oxygen in a reset operation and improving durability.

Figure 2:
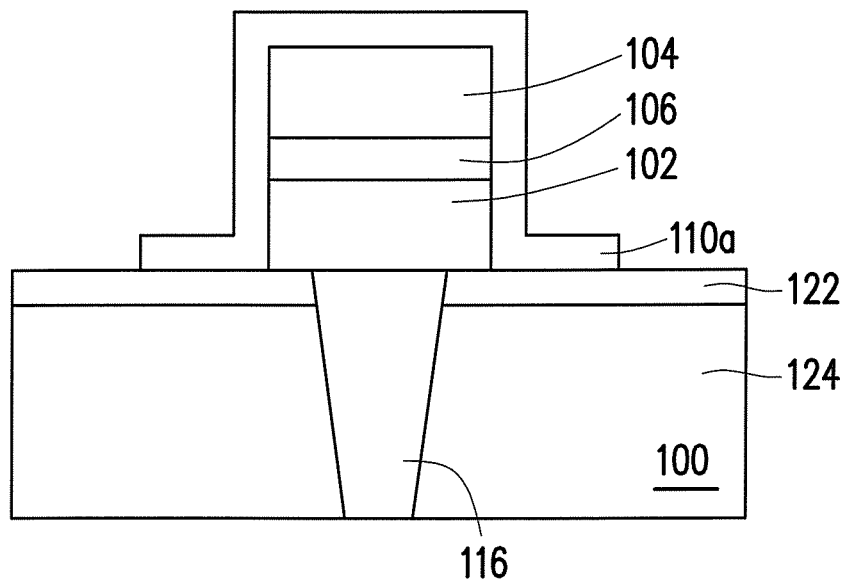
FIG. 2 is a cross-sectional view of a resistive random access memory according to a second embodiment of the invention.

FIG. 2 is a cross-sectional view of a resistive random access memory according to a second embodiment of the invention. In FIG. 2, elements that are identical to those in the first embodiment are marked with the same numerals. Where the materials and properties of each of the layers described below are not specified in detail, they are regarded as identical to those in the first embodiment.

Referring to FIG. 2, the resistive random access memory includes a bottom electrode 102, a top electrode 104, a resistance-switching layer 106, an oxygen exchange layer 108, and a sidewall protective layer 110a.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed over the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example. The bottom electrode 102 and top electrode 104 should not form abrupt corners at their interface with the resistance-switching layer 106 in order to avoid unwanted filaments at that location. The edges of the resistance-switching layer 106, the top electrode 102 and the bottom electrode 104 are continuously linked.

The sidewall protective layer 110a is a liner layer, for example, for blocking contaminants such as hydrogen from the interlayer insulating layer. In the present embodiment, the sidewall protective layer 110a (liner layer) is disposed at sidewalls of the bottom electrode 102, the resistance-switching layer 106, and the top electrode 104. A material of the sidewall protective layer 110a (liner layer) includes a metal oxide such as aluminum oxide ($Al_2O_3$), titanium oxide ($TiO_2$), tantalum oxide ($TaO_2$), or zirconium oxide ($ZrO_2$). The sidewall protective layer 110a is formed by the method of atomic layer deposition (ALD), for example. In another embodiment, the metal oxide is further doped with nitrogen. In other words, the material of the sidewall protective layer 110a (liner layer) includes a metal oxide doped with nitrogen, such as aluminum oxide ($Al_2O_3$) doped with nitrogen, titanium oxide ($TiO_2$) doped with nitrogen, tantalum oxide ($TaO_2$) doped with nitrogen, or zirconium oxide ($ZrO_2$) doped with nitrogen. In this situation, the sidewall protective layer 110a is formed by first forming a metal oxide layer using atomic layer deposition (ALD), performing an oblique ion implantation process, and further doping nitrogen in the metal oxide layer, for example.

As FIG. 2 shows, a capping layer 122 is further optionally disposed between the bottom electrode 102 and the substrate 100 (interlayer insulating layer 124). The capping layer 122 prevents contaminants from the interlayer insulating layer 124, such as hydrogen, from entering the bottom electrode 102. A material of the capping layer 122 includes a metal oxide such as aluminum oxide ($Al_2O_3$), titanium oxide ($TiO_2$), tantalum oxide ($TaO_2$), or zirconium oxide ($ZrO_2$).

In addition, the resistive random access memory of the present embodiment may be disposed with an oxygen exchange layer, an oxygen-rich layer, and a block layer according to the needs, as in the first embodiment.

In the present embodiment, since the sidewall protective layer 110a (liner layer) is disposed at the sidewalls of the bottom electrode 102, the resistance-switching layer 106, and the top electrode 104 (metal-insulating layer-metal (MIM) structure) and the sidewall protective layer 110a (liner layer) adopts a metal oxide free of hydrogen, contaminants (such as hydrogen) from the interlayer insulating layer are prevented from spreading into the metal-insulating layer-metal structure and further affecting performance of the resistive random access memory.

In addition, since the capping layer 122 is further disposed between the bottom electrode 102 and the substrate 100 (interlayer insulating layer 124), the metal-insulating layer-metal structure is completely insulated from the interlayer insulating layer, and contaminants (such as hydrogen) from the interlayer insulating layer are further prevented from spreading into the metal-insulating layer-metal structure.

With the metal-insulating layer-metal structure free from influence of hydrogen, the yield and stability of the resistive random access memory are improved.

Figure 3:
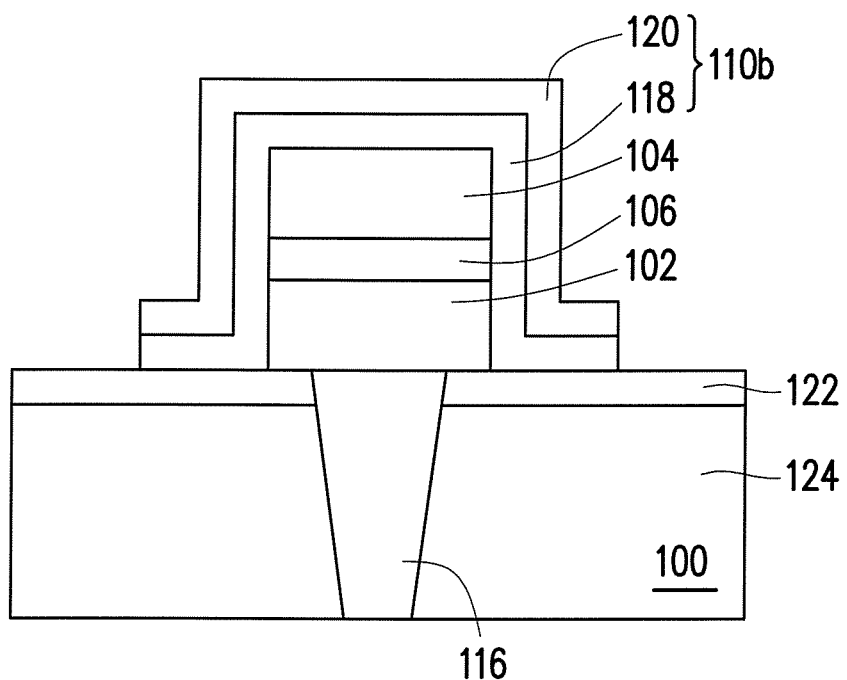
FIG. 3 is a cross-sectional view of a resistive random access memory according to a third embodiment of the invention.

FIG. 3 is a cross-sectional view of a resistive random access memory according to a third embodiment of the invention. In FIG. 3, elements that are identical to those in the first embodiment are marked with the same numerals. Where the materials and properties of each of the layers described below are not specified in detail, they are regarded as identical to those in the first embodiment.

Referring to FIG. 3, the resistive random access memory includes a bottom electrode 102, a top electrode 104, a resistance-switching layer 106, an oxygen exchange layer 108, and a sidewall protective layer 110b.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed over the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example.

The sidewall protective layer 110b is a liner layer, for example, for blocking contaminants from the interlayer insulating layer, such as hydrogen. In the present embodiment, the sidewall protective layer 110b includes a first liner layer 118 and a second liner layer 120. The first liner layer 118 is disposed at sidewalls of the bottom electrode 102, the resistance-switching layer 106, and the top electrode 104. The second liner layer 120 is disposed on the first liner layer 118. A material of the first liner layer 118 includes a metal oxide such as aluminum oxide ($Al_2O_3$), titanium oxide ($TiO_2$), tantalum oxide ($TaO_2$), or zirconium oxide ($ZrO_2$). The first liner layer 118 is formed by the method of atomic layer deposition (ALD), for example. A material of the second liner layer 120 includes a metal nitride or a metal titanate. The metal nitride is aluminum nitride, silicon nitride, or tantalum nitride, for example. The metal titanate is strontium titanate or bismuth titanate, for example.

As FIG. 3 shows, a capping layer 122 is further optionally disposed between the bottom electrode 102 and the substrate 100 (interlayer insulating layer 124). The capping layer 122 prevents contaminants from the interlayer insulating layer 124, such as hydrogen, from entering the bottom electrode 102. A material of the capping layer 122 includes a metal oxide such as aluminum oxide ($Al_2O_3$), titanium oxide ($TiO_2$), tantalum oxide ($TaO_2$), or zirconium oxide ($ZrO_2$).

In addition, the resistive random access memory of the present embodiment may be disposed with an oxygen exchange layer, an oxygen-rich layer, and a block layer according to the needs, as in the first embodiment.

In the present embodiment, since the sidewall protective layer 110b (first liner layer 118 and second liner layer 120) is disposed at the sidewalls of the bottom electrode 102, the resistance-switching layer 106, and the top electrode 104 (metal-insulating layer-metal (MIM) structure) and the sidewall protective layer 110b adopts a multilayer structure, contaminants (such as hydrogen) from the interlayer insulating layer are more effectively prevented from spreading into the metal-insulating layer-metal structure and further affecting performance of the resistive random access memory.

In addition, since the capping layer 122 is further disposed between the bottom electrode 102 and the substrate 100 (interlayer insulating layer 124), the metal-insulating layer-metal structure is completely insulated from the interlayer insulating layer, and contaminants (such as hydrogen) from the interlayer insulating layer are further prevented from spreading into the metal-insulating layer-metal structure.

With the metal-insulating layer-metal structure free from influence of hydrogen, the yield and stability of the resistive random access memory are improved.

In summary of the above, in the resistive random access memory provided by the invention, the arrangement of the sidewall protective layer (as an oxygen supply layer and/or a liner layer (for blocking contaminants from the interlayer insulating layer)) contributes to enhancement of the high-temperature data retention property and durability of memory devices and improves the yield and stability of memory devices.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A resistive random access memory comprising:
   a bottom electrode disposed over a substrate;
   a top electrode disposed over the bottom electrode;
   a resistance-switching layer disposed between the bottom electrode and the top electrode;
   an oxygen exchange layer disposed between the resistance-switching layer and the top electrode, wherein the edges of the oxygen exchange layer, the resistance-switching layer, and the bottom electrode are continuously linked, and an outer portion of the oxygen exchange layer is partially oxidized; and
   a sidewall protective layer as an oxygen supply layer at least disposed at sidewalls of the oxygen exchange layer.

2. The resistive random access memory according to claim 1, wherein the oxygen supply layer is further disposed at sidewalls of the bottom electrode, the resistance-switching layer, and the top electrode.

3. The resistive random access memory according to claim 1, further comprising an oxygen-rich layer disposed between the oxygen exchange layer and the top electrode.

4. The resistive random access memory according to claim 1, further comprising a block layer disposed between the oxygen exchange layer and the resistance-switching layer, where the edge of the block layer is continuously linked with those of the oxygen exchange layer and the resistance-switching layer.

5. The resistive random access memory according to claim 1, wherein a material of the oxygen supply layer comprises aluminum oxide, silicon oxide, hafnium oxide, or zirconium oxide.

6. The resistive random access memory according to claim 1, wherein a material of the oxygen exchange layer comprises titanium, tantalum, hafnium, zirconium, platinum, or aluminum.

7. The resistive random access memory according to claim 1, wherein a material of the oxygen-rich layer comprises titanium oxynitride or tantalum oxynitride.

8. A resistive random access memory comprising:
   a bottom electrode disposed over a substrate;
   a top electrode disposed over the bottom electrode;
   a resistance-switching layer disposed between the bottom electrode and the top electrode;
   an oxygen exchange layer disposed between the resistance-switching layer and the top electrode, wherein the edges of the oxygen exchange layer, the resistance-switching layer, and the bottom electrode are continuously linked, the bottom electrode, the resistance-switching layer, and the oxygen exchange layer have sloped sidewalls, and an outer portion of the oxygen exchange layer is partially oxidized; and
   a sidewall protective layer as an oxygen supply layer at least disposed at sidewalls of the oxygen exchange layer.

* * * * *